US012710484B2

(12) United States Patent
Arimura

(10) Patent No.: US 12,710,484 B2
(45) Date of Patent: Aug. 18, 2026

(54) GROUND FAULT DETECTION APPARATUS HAVING A DETECTION UNIT CONFIGURED TO DETECT A GROUND FAULT ON ONE OF A PLURALITY OF CONDUCTIVE PATHS

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Michio Arimura, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 191 days.

(21) Appl. No.: 18/705,318

(22) PCT Filed: Oct. 11, 2022

(86) PCT No.: PCT/JP2022/037757
§ 371 (c)(1),
(2) Date: Apr. 26, 2024

(87) PCT Pub. No.: WO2023/074337
PCT Pub. Date: May 4, 2023

(65) Prior Publication Data

US 2025/0035712 A1 Jan. 30, 2025

(30) Foreign Application Priority Data

Oct. 29, 2021 (JP) ................................ 2021-177427

(51) Int. Cl.
*G01R 31/52* (2020.01)
*B60L 3/00* (2019.01)
(Continued)

(52) U.S. Cl.
CPC ........... *G01R 31/52* (2020.01); *B60L 3/0069* (2013.01); *B60R 16/033* (2013.01); *H02H 3/16* (2013.01)

(58) Field of Classification Search
CPC ..... G01R 31/52; B60L 3/0069; B60R 16/033; B60R 16/02; H02H 3/16; H02H 3/08; H02J 1/00
(Continued)

(56) References Cited

U.S. PATENT DOCUMENTS

2011/0010568 A1 1/2011 Kageyama et al.
2018/0361961 A1* 12/2018 Maekawa .............. B60R 16/03
(Continued)

FOREIGN PATENT DOCUMENTS

JP 2021142824 A * 9/2021 ................ H02J 7/34

OTHER PUBLICATIONS

International Application No. PCT/JP2022/037757, mailed Dec. 13, 2022. ISA/Japan Patent Office.

*Primary Examiner* — Sreeya Sreevatsa
(74) *Attorney, Agent, or Firm* — Brooks Kushman P.C.

(57) ABSTRACT

A ground fault detection apparatus is used for an on-board system. The on-board system includes a power source unit, a power storage unit, a conductive path, and a disconnection unit. The conductive path includes a first conductive path, a second conductive path, and a third conductive path. The disconnection unit includes a first disconnection unit and a second disconnection unit. A second load is connected to one path out of the second conductive path and the third conductive path, and a third load is connected to the other path. The ground fault detection apparatus includes a detection unit (a current detection unit and a control circuit) configured to detect a ground fault on at least one of the second conductive path and the third conductive path.

9 Claims, 7 Drawing Sheets

(51) Int. Cl.
*B60R 16/033* (2006.01)
*H02H 3/16* (2006.01)

(58) Field of Classification Search
USPC ........................................................ 361/42
See application file for complete search history.

(56) References Cited

U.S. PATENT DOCUMENTS

2019/0052119 A1* 2/2019 Hendrix .................. B60L 58/12
2019/0123545 A1* 4/2019 Maekawa ............. B60R 16/033
2019/0123547 A1 4/2019 Yasunori et al.
2019/0126866 A1 5/2019 Sato et al.
2019/0237988 A1* 8/2019 Maekawa ............. H02J 7/1423

* cited by examiner

100
Power source unit
90
Power source control ECU
15
Determination unit
15A
Control unit
15B
10
Power storage unit
91
94
93
14
Control circuit
12
11
80
76 (74)
75 (74)
83 83A
13
82 82A
81 81A
76B
76A
75B
75A
83B
82B
82B
81B
81B
81B
Second load
Third load
First load
First load
72
(70)
73
(70)
Third load
71
(70)
First load
71
(70)
73
(70)
71
(70)

GROUND FAULT DETECTION APPARATUS HAVING A DETECTION UNIT CONFIGURED TO DETECT A GROUND FAULT ON ONE OF A PLURALITY OF CONDUCTIVE PATHS

CROSS-REFERENCE TO RELATED APPLICATIONS

This application is the U.S. national stage of PCT/JP2022/037757 filed on Oct. 11, 2022, which claims priority of Japanese Patent Application No. JP 2021-177427 filed on Oct. 29, 2021, the contents of which are incorporated herein.

TECHNICAL FIELD

The present disclosure relates to a ground fault detection apparatus.

BACKGROUND

An onboard power source system disclosed in JP 2011-24288A includes: a first power source unit (power storage device), a second power source unit (battery unit), a first switch provided between the two power source units, and a second switch provided on the second power source unit side relative to the first switch. A travelling-related load is connected to a path between the two switches. A general load such as a room lamp is connected to a path between the first switch and the first power source unit. A VS load such as an audio device is connected to a path between the second switch and the second power source unit. With this configuration, even when the general load has a ground fault, power can be supplied to the travelling-related load by switching off the first switch and switching on the second switch, and, even when the VS load has a ground fault, power can be supplied to the travelling-related load by switching on the first switch and switching off the second switch.

However, when both the general load and the VS load have a ground fault, power cannot be supplied to the travelling-related load. In addition, not only an essential load such as an electrically driven brake apparatus but also a power steering apparatus is provided as a travelling-related load. For this reason, when the power steering apparatus has a ground fault, power cannot be supplied to the essential load such as the electrically driven brake apparatus.

The present disclosure provides a technique that enables power supply to an essential load to be kept from stopping when a ground fault occurs on one of a plurality of loads that are less important than the essential load and include a power steering apparatus, and enables power supply to the power steering apparatus to be kept from stopping, if the load that has a ground fault is not the power steering apparatus.

SUMMARY

A ground fault detection apparatus according to the present disclosure is a ground fault detection apparatus that is used for an on-board system that includes: a power source unit, a power storage unit that is different from the power source unit, a conductive path provided between the power source unit and the power storage unit, loads connected to the conductive path, and a disconnection unit provided on the conductive path. The disconnection unit includes a first disconnection unit provided between the power source unit and the power storage unit, and a second disconnection unit provided on the power source unit side relative to the first disconnection unit. The conductive path includes a first conductive path provided between the power storage unit and the first disconnection unit, a second conductive path provided between the first disconnection unit and the second disconnection unit, and a third conductive path provided between the second disconnection unit and the power source unit. The loads include a first load that includes an essential load, a second load that includes a power steering apparatus, and a third load that is less important than the essential load. The first load is connected to the first conductive path, the second load is connected to one path out of the second conductive path and the third conductive path, and the third load is connected to the other path out of the second conductive path and the third conductive path. The first disconnection unit is switched between a first allowed state in which a current is allowed to flow from the first conductive path side to the second conductive path side and a first disconnected state where the current is stopped. The second disconnection unit is switched between a second allowed state where a current is allowed to flow from the second conductive path side to the third conductive path side and from the third conductive path side to the second conductive path side and a second disconnected state where the current is stopped, and the ground fault detection apparatus includes a detection unit configured to detect a ground fault on at least one of the second conductive path and the third conductive path.

Advantageous Effects

According to the present disclosure, when a ground fault occurs on one of a plurality of loads that are less important than an essential load and include a power steering apparatus, it is possible to keep power supply to the essential load from stopping, and, if the load that has a ground fault is not the power steering apparatus, it is possible to keep power supply to the power steering apparatus from stopping.

DETAILED DESCRIPTION OF PREFERRED EMBODIMENTS

Figure 1:
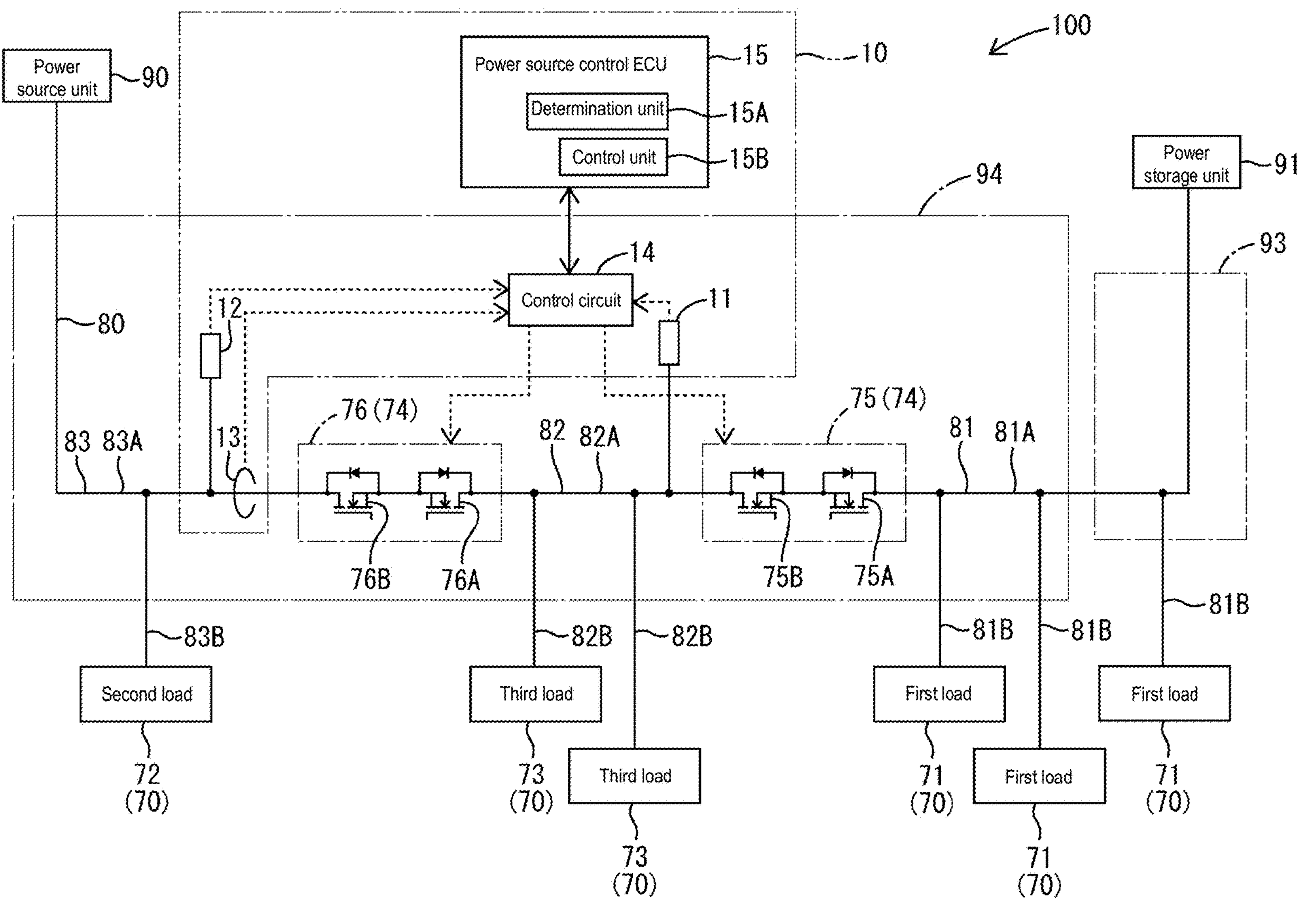
FIG. 1 is a circuit diagram schematically showing a configuration of an on-board system according to a first embodiment.

Hereinafter, embodiments of the present disclosure will be listed and described.

In a first aspect, a ground fault detection apparatus that is used for an on-board system includes; a power source unit, a power storage unit that is different from the power source unit, a conductive path provided between the power source unit and the power storage unit, loads connected to the conductive path, and a disconnection unit provided on the conductive path. The disconnection unit includes a first disconnection unit provided between the power source unit and the power storage unit, and a second disconnection unit provided on the power source unit side relative to the first disconnection unit. The conductive path includes a first conductive path provided between the power storage unit and the first disconnection unit, a second conductive path provided between the first disconnection unit and the second disconnection unit, and a third conductive path provided between the second disconnection unit and the power source unit. The loads include a first load that includes an essential load, a second load that includes a power steering apparatus, and a third load that is less important than the essential load. The first load is connected to the first conductive path, the second load is connected to one path out of the second conductive path and the third conductive path, and the third load is connected to the other path out of the second conductive path and the third conductive path. The first disconnection unit is switched between a first allowed state in which a current is allowed to flow from the first conductive path side to the second conductive path side and a first disconnected state where the current is stopped. The second disconnection unit is switched between a second allowed state where a current is allowed to flow from the second conductive path side to the third conductive path side and from the third conductive path side to the second conductive path side and a second disconnected state where the current is stopped, and the ground fault detection apparatus includes a detection unit configured to detect a ground fault on at least one of the second conductive path and the third conductive path.

The above ground fault detection apparatus can detect a ground fault on at least one of the second conductive path and the third conductive path.

For this reason, in a configuration in which the second load is connected to the third conductive path, for example, by configuring the above on-board system such that the first disconnection unit switches to the first disconnected state and the second disconnection unit switches to the second disconnected state when a ground fault is detected by the detection unit, it is possible to keep power supply to the first load from stopping when a ground fault is detected by the detection unit, and, if the ground fault site is on the second conductive path, it is possible to keep power supply to the second load from stopping.

In addition, in a configuration in which the second load is connected to the second conductive path, for example, by configuring the above on-board system such that determination is performed as to whether a ground fault site is on the second conductive path side or the third conductive path side, and the first disconnection unit is switched to the first disconnected state if it is determined that the ground fault site is on the second conductive path side, and the first disconnection unit is switched to the first allowed state and the second disconnection unit is switched to the second disconnected state if it is determined that the ground fault site is on the third conductive path side, it is possible to keep power supply to the first load from stopping when a ground fault is detected by the detection unit, and, if the ground fault site is on the third conductive path side, it is possible to keep power supply to the second load from stopping.

That is to say, the ground fault detection apparatus can keep power supply to the essential load from stopping when a ground fault has occurred on the path connected to the loads (the second load and the third load) that are less important than the essential load, and can keep power supply to the power steering apparatus from stopping when a ground fault has not occurred on the path connected to the power steering apparatus.

In a second aspect, in the ground fault detection apparatus according to the a first aspect may include a determination unit configured to determine, when a ground fault is detected on at least one of the second conductive path and the third conductive path by the detection unit, whether the ground fault site is on the second conductive path side or the third conductive path side.

The ground fault detection apparatus can determine, by itself, whether the ground fault site is on the second conductive path side or the third conductive path side.

In a third aspect, in the ground fault detection apparatus according to the second aspect, the determination unit may determine whether a ground fault site is on the second conductive path side or the third conductive path side, based on a voltage of at least one of the second conductive path and the third conductive path when the first disconnection unit is in the first disconnected state and the second disconnection unit is in the second disconnected state.

The ground fault detection apparatus can determine whether a ground fault site is on the second conductive path side or the third conductive path side, based on a voltage of at least one of the second conductive path and the third conductive path when the first disconnection unit is in the first disconnected state and the second disconnection unit is in the second disconnected state.

In a fourth aspect, the ground fault detection apparatus according to the third aspect may include a control unit configured to perform control so as to switch the first disconnection unit to the first disconnected state and perform control so as to switch the second disconnection unit to the second disconnected state when a ground fault is detected on at least one of the second conductive path and the third conductive path by the detection unit. The determination unit may determine whether a ground fault site is on the second conductive path side or the third conductive path side, based on a voltage of at least one of the second conductive path and the third conductive path, in a state where the control unit performs control so as to switch the first disconnection unit to the first disconnected state and performs control so as to switch the second disconnection unit to the second disconnected state.

When a ground fault on one of the second conductive path and the third conductive path is detected by the detection unit, the ground fault detection apparatus can perform control so as to switch the first disconnection unit to the first disconnected state and the second disconnection unit to the second disconnected state, and determine whether the ground fault site is on the second conductive path side or the third conductive path side based on the voltage of at least one of the second conductive path and the third conductive path.

In a fifth aspect, in the ground fault detection apparatus according to the second aspect, the determination unit may include a current detection unit configured to detect a current flowing through at least one of the second conductive path and the third conductive path, and determine whether the ground fault site is on the second conductive path side or the third conductive path side, based on a direction of a current flowing through at least one of the second conductive path and the third conductive path.

The ground fault detection apparatus can determine whether the ground fault site is on the second conductive path side or the third conductive path side, based on the direction of a current flowing through at least one of the second conductive path and the third conductive path.

In a sixth aspect, in the ground fault detection apparatus according to any one of the second through the fifth aspects, the second load may be connected to the third conductive path. The ground fault detection apparatus may include a control unit configured to perform at least one of an operation of performing control so as to switch the first disconnection unit to the first disconnected state and an operation of performing control so as to switch the second disconnection unit to the second disconnected state if it is determined by the determination unit that a ground fault site is on the third conductive path side, and perform control so as to switch the first disconnection unit to the first disconnected state and perform control so as to switch the second disconnection unit to the second disconnected state if it is determined by the determination unit that a ground fault site is on the second conductive path side.

The ground fault detection apparatus can keep power that is supplied to the first load from stopping irrespective of whether it is determined that a ground fault site is on the second conductive path side or the third conductive path side, and keep power that is supplied to the second load from stopping if it is determined that a ground fault site is on the second conductive path side.

In a seventh aspect, in the ground fault detection apparatus according to any one of the second through the fifth aspects, the second load may be connected to the second conductive path. The ground fault detection apparatus may include a control unit configured to perform control so as to switch the first disconnection unit to the first allowed state and perform control so as to switch the second disconnection unit to the second disconnected state if it is determined by the determination unit that a ground fault site is on the third conductive path side, and perform control so as to switch the first disconnection unit to the first disconnected state if it is determined that a ground fault site is on the second conductive path side.

The ground fault detection apparatus can keep power that is supplied to the first load from stopping irrespective of whether it is determined that a ground fault site is on the second conductive path side or the third conductive path side, and keep power that is supplied to the second load from stopping if it is determined that a ground fault site is on the third conductive path side.

In an eighth aspect, in the ground fault detection apparatus according to the fourth aspect, the second load may be connected to the third conductive path.

When the second disconnection unit is switched to the second disconnected state in order to perform determination on a ground fault site, it is possible to keep power supply to the second load from being suspended.

In a ninth aspect, in the ground fault detection apparatus according to any one of the first through the fifth aspects, the second load may be connected to the second conductive path.

According to the above configuration, even when the power source unit has a ground fault, power can be supplied from the power storage unit to the second load.

First Embodiment

An on-board system 100 shown in FIG. 1 is a system that is mounted in a vehicle. The on-board system 100 includes a power source unit 90, a power storage unit 91, a conductive path 80, and loads 70. The on-board system 100 can supply power that is based on the power source unit 90 and the power storage unit 91, to the loads 70 via the conductive path 80.

The power source unit 90 is a DC power source, and is constituted by a battery such as a lithium ion battery, a DCDC converter, and the like. The power storage unit 91 is a power source different from the power source unit 90, and is configured as a battery such as a lead battery. The conductive path 80 is provided between the power source unit 90 and the power storage unit 91. One end of the conductive path 80 is connected to the power storage unit 91, and the other end of the conductive path 80 is connected to the power source unit 90. The loads 70 are connected to the conductive path 80.

The loads 70 include first loads 71, a second load 72, and third loads 73. The first loads 71 are loads that include an essential load. There are a plurality of first loads 71. The essential load is a load that is more important than the second load 72 and the third loads 73. The importance is defined based on function safety levels stipulated by ISO26262, for example. The function safety levels are classified as five categories, namely, QM (Quality Management), ASIL (Automotive Safety Integrity Level)-A, ASIL-B, ASIL-C, and ASIL-D in order from the lowest importance. A load with a higher function safety level has a higher importance. In the present embodiment, a load to which ASIL (i.e., ASIL-A to D) is allocated is set as an "essential load". The essential load is an ECU (Electronic Control Unit) of an electrically driven brake apparatus, an ECU of a shift-by-wire apparatus, an ECU of a door-locking apparatus, a display device, an ECU of an airbag apparatus, a DCM (Data Communication Module), or the like.

The second load 72 and the third loads 73 are loads that are less important than the essential load, and, in the present embodiment, whose function safety level is QM. The second load 72 includes a power steering apparatus only. The third loads 73 are loads that are less important than the essential load and are other than the second load 72. A plurality of third loads 73 are provided. The third loads 73 are headlights, a sound output device, and the like.

The on-board system 100 includes a disconnection unit 74 provided on the conductive path 80. The disconnection unit 74 includes a first disconnection unit 75 provided between the power source unit 90 and the power storage unit 91, and a second disconnection unit 76 provided on the power source unit 90 side relative to the first disconnection unit 75.

The above conductive path 80 includes a first conductive path 81, a second conductive path 82, and a third conductive path 83. The first conductive path 81 is provided between the power storage unit 91 and the first disconnection unit 75. The first conductive path 81 includes a first main path 81A connected to an output end of the power storage unit 91 and one end of the first disconnection unit 75, and first branch paths 81B that branch from the first main path 81A. A plurality of first branch paths 81B are provided. The first loads 71 are respectively connected to the first branch path 81B. The second conductive path 82 is provided between the first disconnection unit 75 and the second disconnection unit 76. The second conductive path 82 includes a second main path 82A connected to the other end of the first disconnection unit 75 and one end of the second disconnection unit 76, and a second branch path 82B that branches from the second main path 82A. The second load 72 is connected to the second branch path 82B. The third conductive path 83 is provided between the second disconnection unit 76 and the power source unit 90. The third conductive path 83 includes a third main path 83A connected to the other end of the second disconnection unit 76 and an output end of the power source unit 90, and third branch paths 83B that branch from the third main path 83A. A plurality of third branch paths 83B are provided. The third loads 73 are respectively connected to the third branch paths 83B.

The above first disconnection unit 75 is switched between a first allowed state where a current is allowed to flow from the first conductive path 81 side to the second conductive path 82 side and a disconnected state where such a current is stopped. In the first allowed state, the first disconnection unit 75 also allows a current to flow from the second conductive path 82 side to the first conductive path 81 side. In the first disconnected state, the first disconnection unit 75 also stops flow of a current from the second conductive path 82 side to the first conductive path 81 side. The first disconnection unit 75 includes switching elements 75A and 75B, and enters the first allowed state as a result of the switching elements 75A and 75B being switched to an on-state, and enters the first disconnected state as a result of the switching elements 75A and 75B being switched to an off-state. In the present embodiment, the switching elements 75A and 75B are FETs (Field Effect Transistors), and are disposed in series in opposite directions.

The above second disconnection unit 76 is switched between a second allowed state where a current is allowed to flow from the third conductive path 83 side to the second conductive path 82 and from the second conductive path 82 side to the third conductive path 83 side and a second disconnected state where such a current is stopped. The second disconnection unit 76 includes switching elements 76A and 76B, and enters the second allowed state as a result of the switching elements 76A and 76B being switched to an on-state, and enters the second disconnected state as a result of the switching elements 76A and 76B being switched to an off-state. In the present embodiment, the switching elements 76A and 76B are FETs, and are disposed in series in opposite directions.

The on-board system 100 includes a ground fault detection apparatus 10. The ground fault detection apparatus 10 is used for the on-board system 100. The ground fault detection apparatus 10 can detect a ground fault on at least one of the second conductive path 82 and the third conductive path 83. The ground fault detection apparatus 10 includes a first voltage detection unit 11, a second voltage detection unit 12, a current detection unit 13, a control circuit 14, and a power source control ECU 15. The power source control ECU 15 includes a determination unit 15A and a control unit 15B. The determination unit 15A and the control unit 15B are each constituted by an MCU (Micro Controller Unit). Note that the current detection unit 13 and the control circuit 14 are equivalent to examples of a "detection unit".

The on-board system 100 is configured such that particularly the first conductive path 81 connected to the first loads 71 is unlikely to have a ground fault. The on-board system 100 includes a first power source box 93 and a second power source box 94. A portion of the first conductive path 81 is disposed in the first power source box 93. The second power source box 94 is disposed outside the first power source box 93. A portion of the first conductive path 81, a portion of the second conductive path 82, a portion of the third conductive path 83, the first disconnection unit 75, the second disconnection unit 76, the first voltage detection unit 11, the second voltage detection unit 12, the current detection unit 13, and the control circuit 14 are disposed in the second power source box 94. The power source unit 90, the power storage unit 91, the first loads 71, the second load 72, the third loads 73, and the power source control ECU 15 are disposed outside the first power source box 93 and the second power source box 94. A configuration in which the power storage unit 91 and the first loads 71 connected to the first conductive path 81 are coupled to the first power source box 93 or the second power source box 94 by a bus bar, a configuration in which a protector is attached, and the like are adopted. Alternatively, a fuse is provided on the first branch path 81B. In addition, a configuration in which the first power source box 93 and the second power source box 94 are also coupled by a bus bar, a configuration in which a protector is attached, and the like are adopted. Accordingly, the on-board system 100 is configured such that particularly the first conductive path 81 is unlikely to have a ground fault. In the on-board system 100 configured as described above, when a ground fault is detected on the second conductive path 82 or the third conductive path 83 in a state where the first disconnection unit 75 is in the first allowed state and the second disconnection unit 76 is in the second disconnected state, the ground fault detection apparatus 10 determines that a ground fault on at least one of the second conductive path 82 and the third conductive path 83 has been detected. The ground fault detection apparatus 10 is configured to determine, when a ground fault on at least one of the second conductive path 82 and the third conductive path 83 is detected, whether the ground fault site is on the second conductive path 82 side or the third conductive path 83 side, and control the first disconnection unit 75 and the second disconnection unit 76 based on the determination result. The following description relates to the specific operation.

The first voltage detection unit 11 can detect the voltage of the second conductive path 82. Note that, in the present specification, a "voltage" refers to a voltage that is based on the ground. The first voltage detection unit 11 is configured as a known voltage detection circuit, for example. The first voltage detection unit 11 outputs a signal that enables the detected voltage to be specified.

The second voltage detection unit 12 can detect the voltage of the third conductive path 83. The second voltage detection unit 12 is configured as a known voltage detection circuit, for example. The second voltage detection unit 12 outputs a signal that enables the detected voltage to be specified.

The current detection unit 13 can detect a current flowing through the third conductive path 83. The current detection unit 13 is configured as a known current detection circuit that uses a current transformer or a shunt resistor, for example. The current detection unit 13 outputs a signal that enables the detected current to be specified.

The control circuit 14 includes an MCU, an AD converter, a drive circuit, a communication unit, and the like. Signals output from the first voltage detection unit 11, the second voltage detection unit 12 and the current detection unit 13 are input to the control circuit 14. The control circuit 14 can specify the voltage of the second conductive path 82, the voltage of the third conductive path 83, and the value of a current flowing through the third conductive path 83, based on the input signals. The control circuit 14 can detect a ground fault on at least one of the second conductive path 82 and the third conductive path 83. The control circuit 14 determines whether or not the value of a current flowing through the third conductive path 83 has exceeded a predetermined threshold current in a state where power is being supplied from at least one of the power source unit 90 and the power storage unit 91 to the loads 70. The control circuit 14 determines that none of the second conductive path 82 and the third conductive path 83 has a ground fault if it is determined that the value of a current flowing through the third conductive path 83 is lower than or equal to the threshold current, and determines that at least one of the second conductive path 82 and the third conductive path 83 has a ground fault if it is determined that the value of a current flowing through the third conductive path 83 has exceeded the threshold.

The power source control ECU 15 can obtain, from the control circuit 14, the voltage of the second conductive path 82, the voltage of the third conductive path 83, and the value of a current flowing through the third conductive path 83. In addition, the power source control ECU 15 can grasp that a ground fault on at least one of the second conductive path 82 and the third conductive path 83 has been detected, based on signals input from the control circuit 14.

The control unit 15B of the power source control ECU 15 can control the first disconnection unit 75 and the second disconnection unit 76 via the control circuit 14. When a ground fault on at least one of the second conductive path 82 and the third conductive path 83 is detected by the control circuit 14, the control unit 15B performs control so as to switch the first disconnection unit 75 to the first disconnected state and performs control so as to switch the second disconnection unit 76 to the second disconnected state.

When a ground fault on at least one of the second conductive path 82 and the third conductive path 83 is detected by the control circuit 14, the determination unit 15A of the power source control ECU 15 determines whether the ground fault site is on the second conductive path 82 side or the third conductive path 83 side. The determination unit 15A determines whether the ground fault site is on the second conductive path 82 side or the third conductive path 83 side, based on the voltage of at least one of the second conductive path 82 and the third conductive path 83 when the first disconnection unit 75 is in the first disconnected state and the second disconnection unit 76 is in the second disconnected state. The determination unit 15A determines whether or not the voltage of the second conductive path 82 is lower than or equal to a predetermined threshold voltage, and, if it is determined that the voltage of the second conductive path 82 is lower than or equal to the threshold, determines that the ground fault site is on the second conductive path 82 side. In addition, the determination unit 15A determines whether or not the voltage of the third conductive path 83 is lower than or equal to the above threshold voltage, and if it is determined that the voltage of the third conductive path 83 is lower than or equal to the threshold, determines that the ground fault site is on the third conductive path 83 side. Note that the threshold voltage is a value of 0 V or higher.

Figure 2:
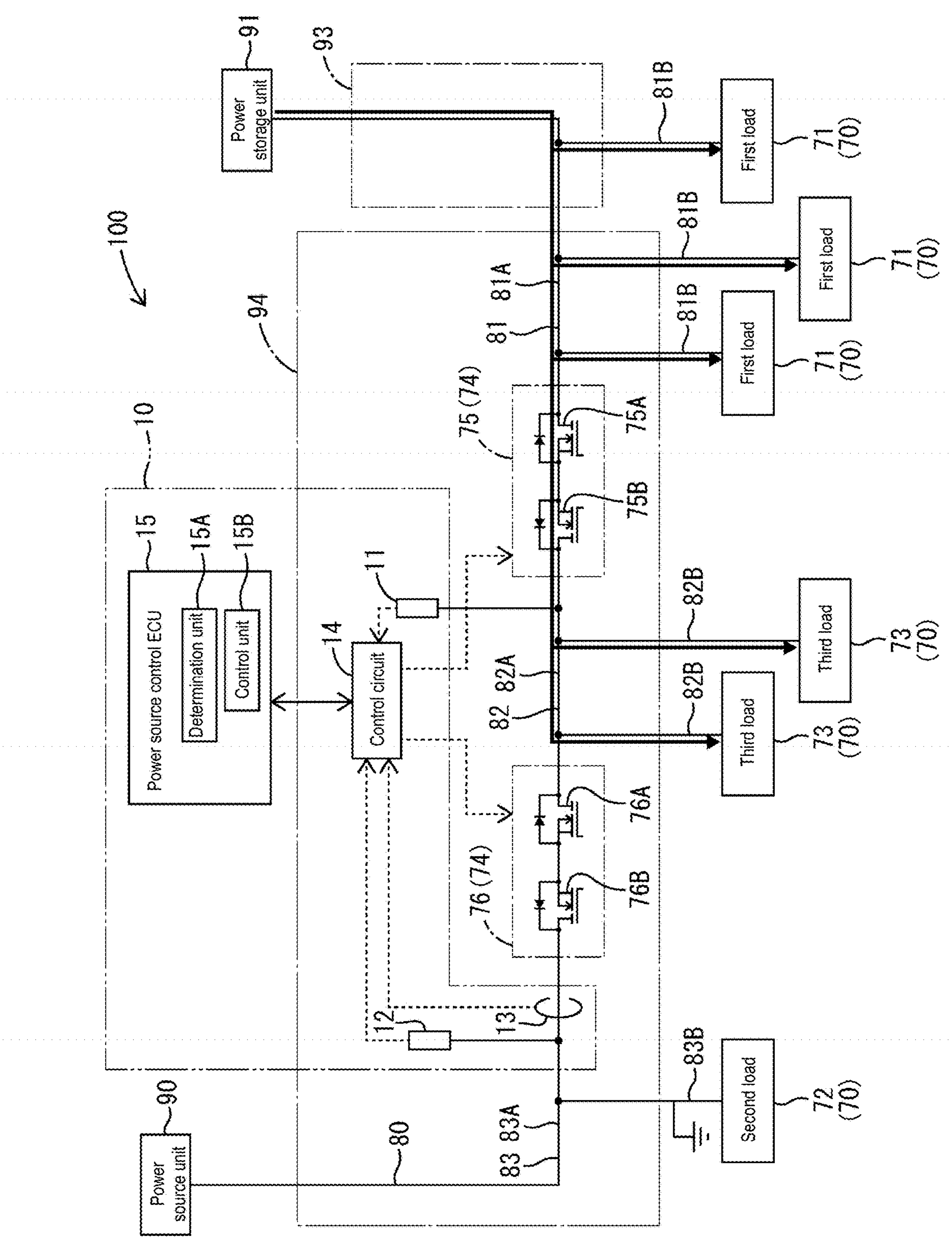
FIG. 2 is an explanatory diagram conceptually showing operations of the on-board system if it is determined that a ground fault site is on a third conductive path side.
Figure 3:
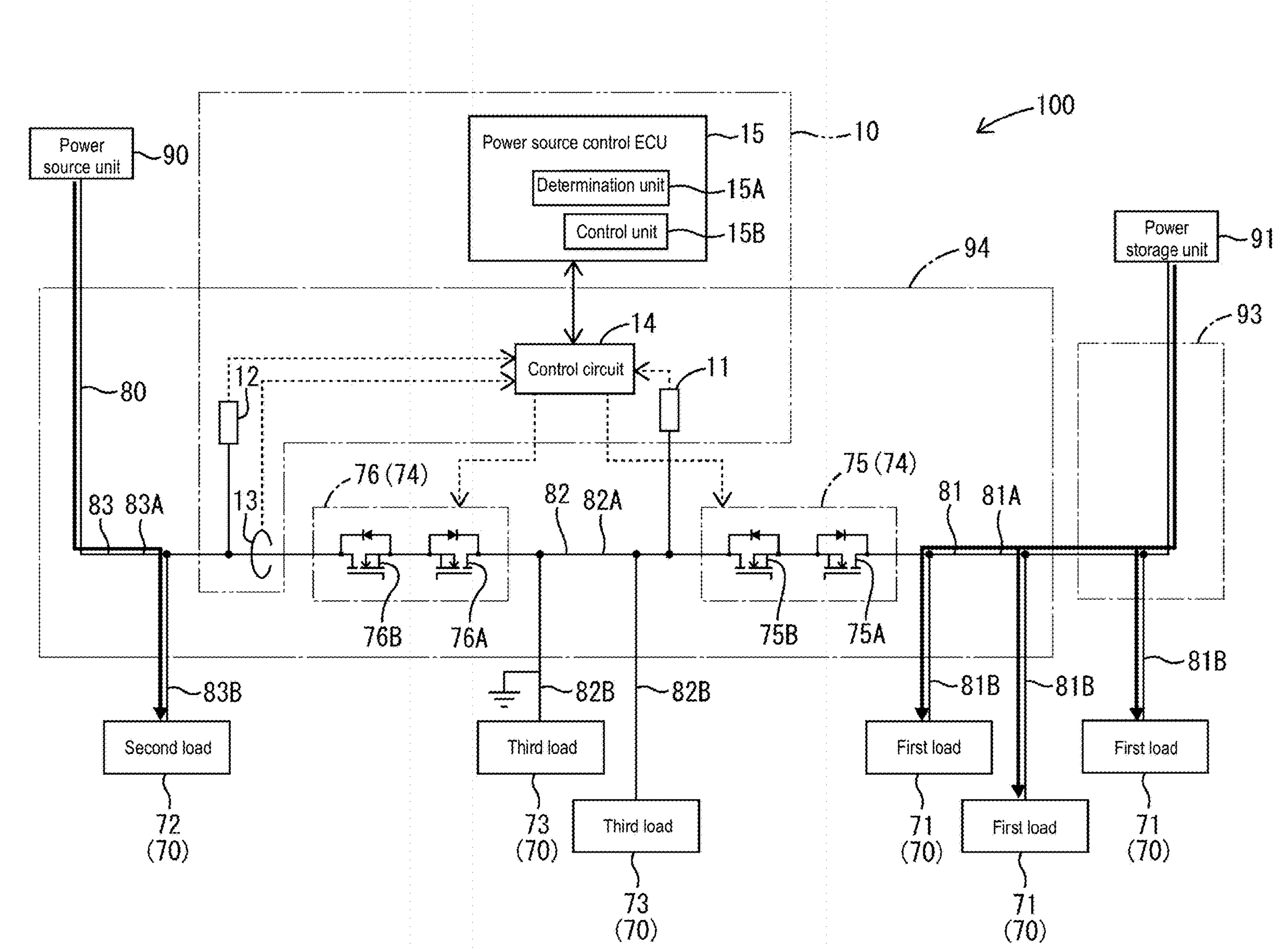
FIG. 3 is an explanatory diagram conceptually showing operations of the on-board system if it is determined that a ground fault site is on a second conductive path side.

If it is determined that the ground fault site is on the third conductive path 83 side, the control unit 15B switches the first disconnection unit 75 to the first allowed state and maintains the second disconnection unit 76 in the second disconnected state. Accordingly, as shown in FIG. 2, the ground fault detection apparatus 10 can supply power from the power storage unit 91 to the first loads 71 and the third loads 73. If it is determined that the ground fault site is on the second conductive path 82 side, the control unit 15B maintains the first disconnection unit 75 in the first disconnected state, and maintains the second disconnection unit 76 in the second disconnected state. Accordingly, as shown in FIG. 3, the ground fault detection apparatus 10 can supply power from the power storage unit 91 to the first loads 71 and from the power source unit 90 to the second load 72.

As described above, when a ground fault on at least one of the second conductive path 82 and the third conductive path 83 is detected by the control circuit 14, the ground fault detection apparatus 10 temporarily switches the first disconnection unit 75 to the first disconnected state and switches the second disconnection unit 76 to the second disconnected state. Accordingly, the ground fault detection apparatus 10 can keep a large current from flowing to a path on which no ground fault has occurred. Moreover, in the on-board system 100, the first loads 71 are connected to the first conductive path 81 and the second load 72 is connected to the third conductive path 83, and thus it is possible to keep power supply to the first loads 71 from being suspended, and, if no ground fault has occurred on the third conductive path 83 side, it is also possible to keep power supply to the second load 72 from being suspended.

Furthermore, the ground fault detection apparatus 10 determines whether the ground fault site is on the second conductive path 82 side or the third conductive path 83 side, based on the voltage of the second conductive path 82 or the voltage of the third conductive path 83, in a state where the first disconnection unit 75 is switched to the first disconnected state and the second disconnection unit 76 is switched to the second disconnected state. Then, if it is determined that the ground fault site is on the third conductive path 83 side, the ground fault detection apparatus 10 switches the first disconnection unit 75 to the first allowed state, and maintains the second disconnection unit 76 in the second disconnected state. In addition, if it is determined that the ground fault site is on the second conductive path 82 side, the ground fault detection apparatus 10 maintains the first disconnection unit 75 in the first disconnected state, and maintains the second disconnection unit 76 in the second disconnected state. Accordingly, the ground fault detection apparatus 10 can keep power supply to the first loads 71 from stopping irrespective of whether the ground fault site is on the second conductive path 82 side or the third conductive path 83 side, and, if the ground fault site is not on the third conductive path 83 side, can also keep power supply to the second load 72 from stopping.

Second Embodiment

Figure 4:
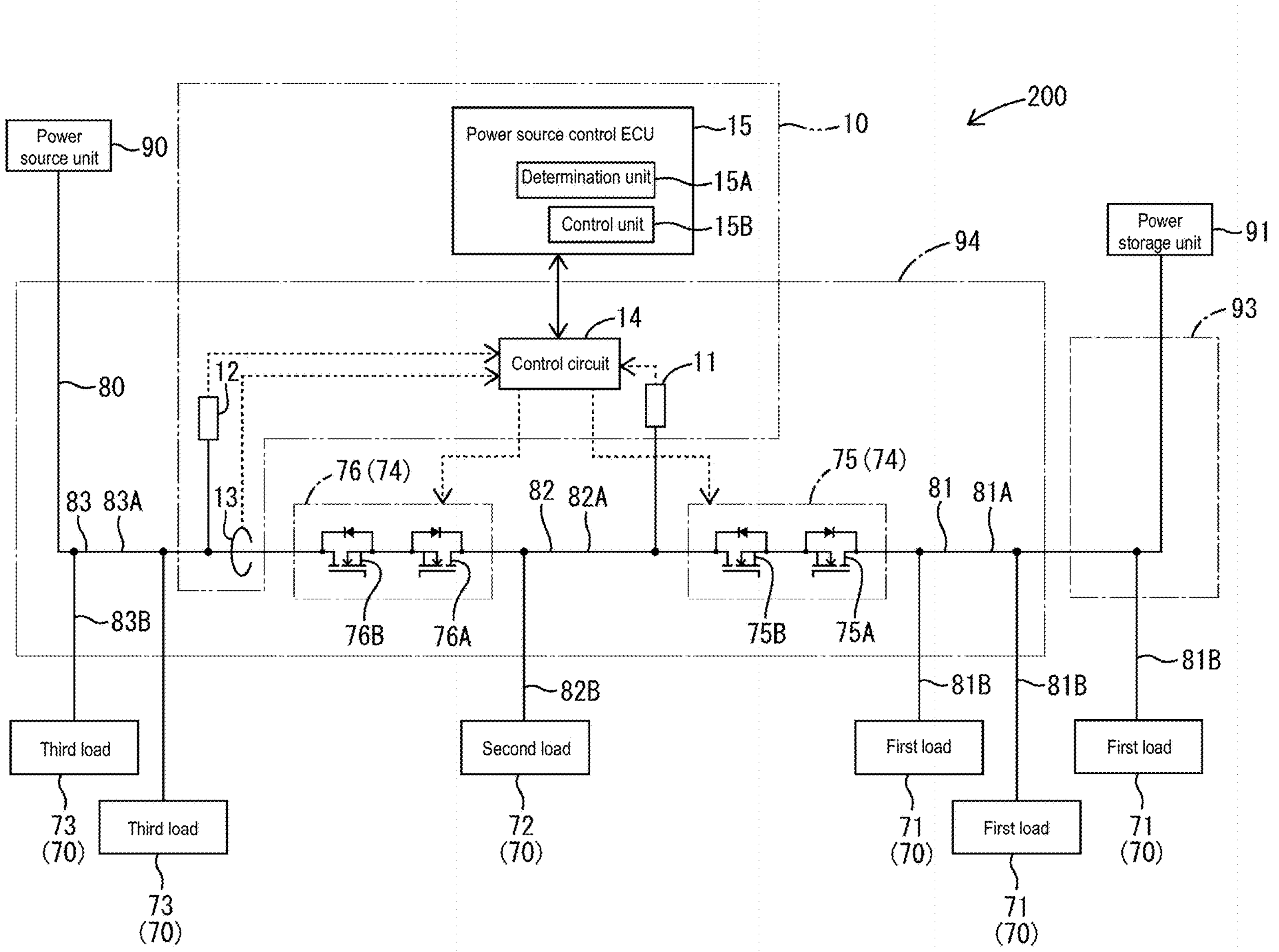
FIG. 4 is a circuit diagram schematically showing a configuration of an on-board system according to a second embodiment.

An on-board system 200 according to a second embodiment shown in FIG. 4 is different from the on-board system 100 according to the first embodiment in that the second load 72 is connected to the second conductive path 82 and the third loads 73 are connected to the third conductive path 83, and the on-board system 200 and the on-board system 100 are the same with respect to the other configurations. In the following description, the same configurations as the on-board system 100 according to the first embodiment are given the same reference numerals, and a detailed description thereof is omitted.

The control circuit 14 determines whether or not the value of a current flowing through the third conductive path 83 has exceeded a predetermined threshold current, in a state where power is supplied from at least one of the power source unit 90 and the power storage unit 91 to the loads 70. If it is determined that the value of a current flowing through the third conductive path 83 is lower than or equal to the threshold current, the control circuit 14 determines that none of the second conductive path 82 and the third conductive path 83 has a ground fault, and, if it is determined that the value of a current flowing through the third conductive path 83 has exceeded the threshold current, determines that at least one of the second conductive path 82 and the third conductive path 83 has a ground fault.

When a ground fault on at least one of the second conductive path 82 and the third conductive path 83 is detected by the control circuit 14, the control unit 15B of the power source control ECU 15 performs control so as to switch the first disconnection unit 75 to the first disconnected state and performs control so as to switch the second disconnection unit 76 to the second disconnected state.

When a ground fault on at least one of the second conductive path 82 and the third conductive path 83 is detected by the control circuit 14, the determination unit 15A of the power source control ECU 15 determines whether the ground fault site is on the second conductive path 82 side or the third conductive path 83 side. The determination method is the same as that in the first embodiment, and thus a detailed description is omitted.

Figure 5:
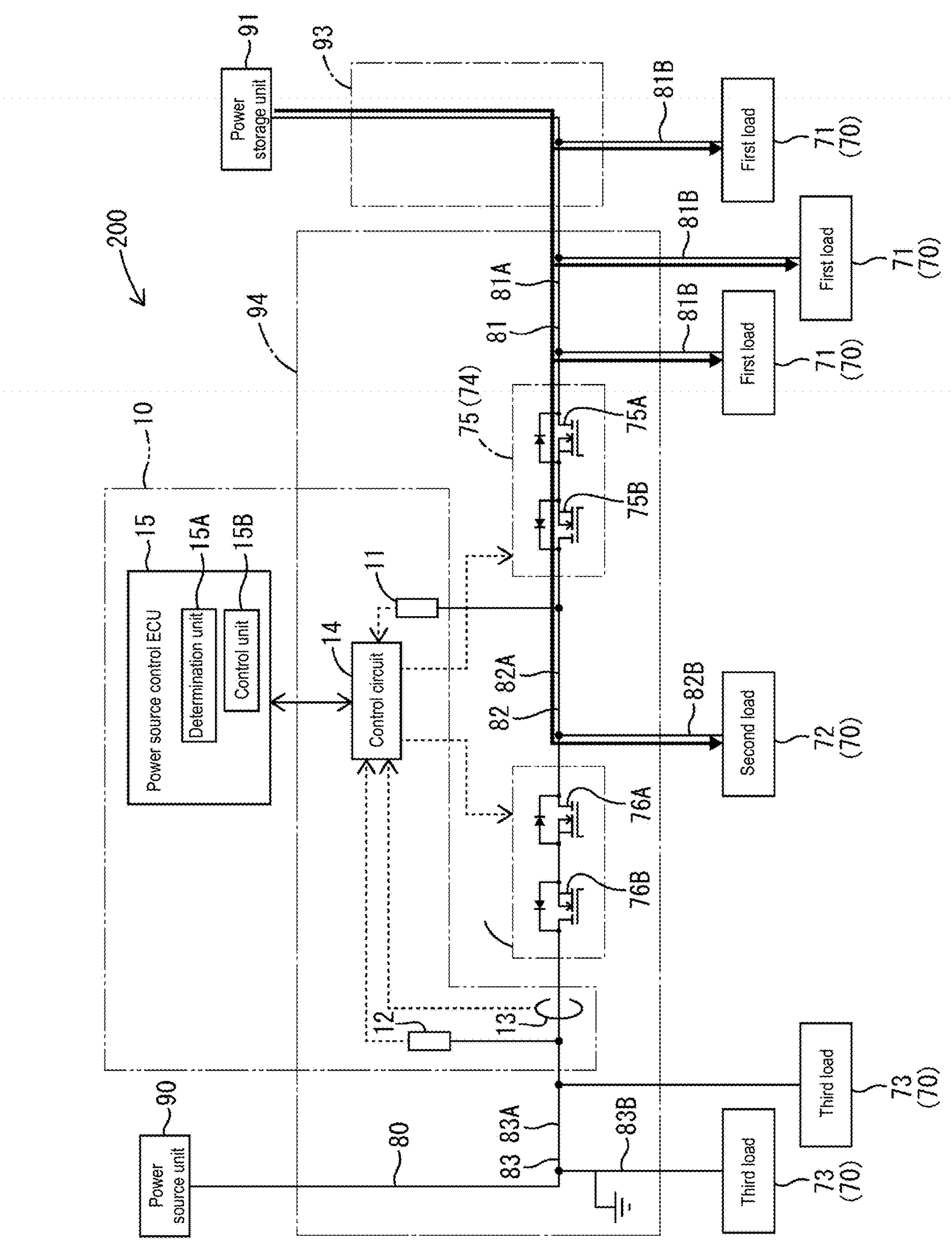
FIG. 5 is an explanatory diagram conceptually showing operations of the on-board system if it is determined that a ground fault site is on a third conductive path side.
Figure 6:
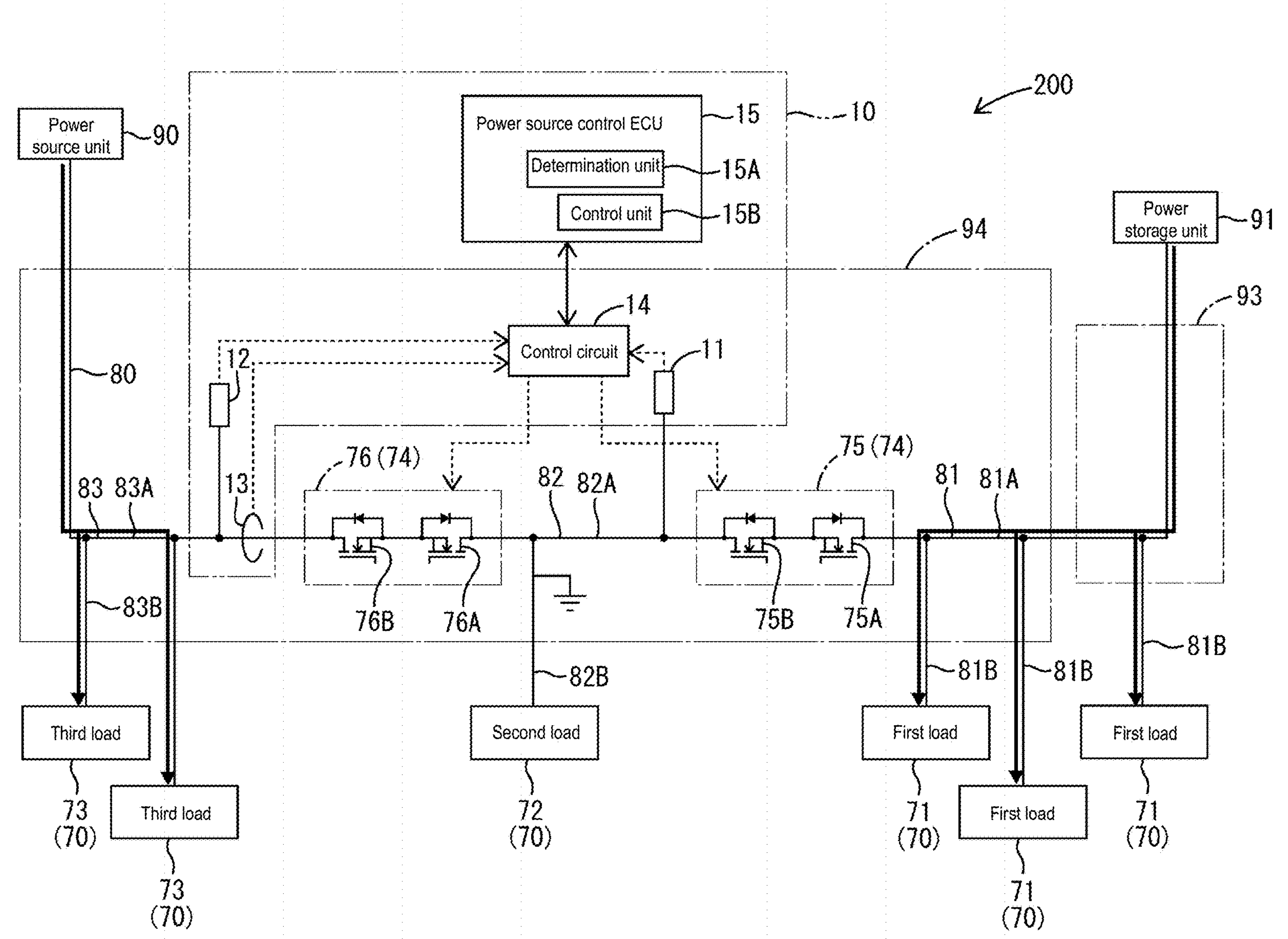
FIG. 6 is an explanatory diagram conceptually showing operations of the on-board system if it is determined that a ground fault site is on a second conductive path side.

If it is determined that the ground fault site is on the third conductive path 83 side, the control unit 15B switches the first disconnection unit 75 to the first allowed state, and maintains the second disconnection unit 76 in the second disconnected state. Accordingly, as shown in FIG. 5, the ground fault detection apparatus 10 can supply power from the power storage unit 91 to the first loads 71 and the second load 72. If it is determined that the ground fault site is on the second conductive path 82 side, the control unit 15B maintains the first disconnection unit 75 in the first disconnected state, and maintains the second disconnection unit 76 in the second disconnected state. Accordingly, as shown in FIG. 6, the ground fault detection apparatus 10 can supply power from the power storage unit 91 to the first loads 71 and from the power source unit 90 to the third loads 73.

As described above, when a ground fault on at least one of the second conductive path 82 and the third conductive path 83 is detected by the control circuit 14, the ground fault detection apparatus 10 temporarily switches the first disconnection unit 75 to the first disconnected state and switches the second disconnection unit 76 to the second disconnected state. Accordingly, the ground fault detection apparatus 10 can keep a large current from flowing to a path on which no ground fault has occurred.

Furthermore, the ground fault detection apparatus 10 determines whether the ground fault site is on the second conductive path 82 side or the third conductive path 83 side, based on the voltage of the second conductive path 82 and the voltage of the third conductive path 83, in a state where the first disconnection unit 75 is switched to the first disconnected state and the second disconnection unit 76 is switched to the second disconnected state. Then, if it is determined that the ground fault site is on the third conductive path 83 side, the ground fault detection apparatus 10 switches the first disconnection unit 75 to the first allowed state, and maintains the second disconnection unit 76 in the second disconnected state. In addition, if it is determined that the ground fault site is on the second conductive path 82 side, the ground fault detection apparatus 10 maintains the first disconnection unit 75 in the first disconnected state, and maintains the second disconnection unit 76 in the second disconnected state. Accordingly, the ground fault detection apparatus 10 can keep power supply to the first loads 71 from stopping irrespective of whether the ground fault site is on the second conductive path 82 side or the third conductive path 83 side, and if the ground fault site is not on the second conductive path 82 side, can keep power supply to the second load 72 from stopping.

Furthermore, the second load 72 is connected to the second conductive path 82, and thus, even when the power source unit 90 has a ground fault, it is possible to supply power from the power storage unit 91.

Third Embodiment

Figure 7:
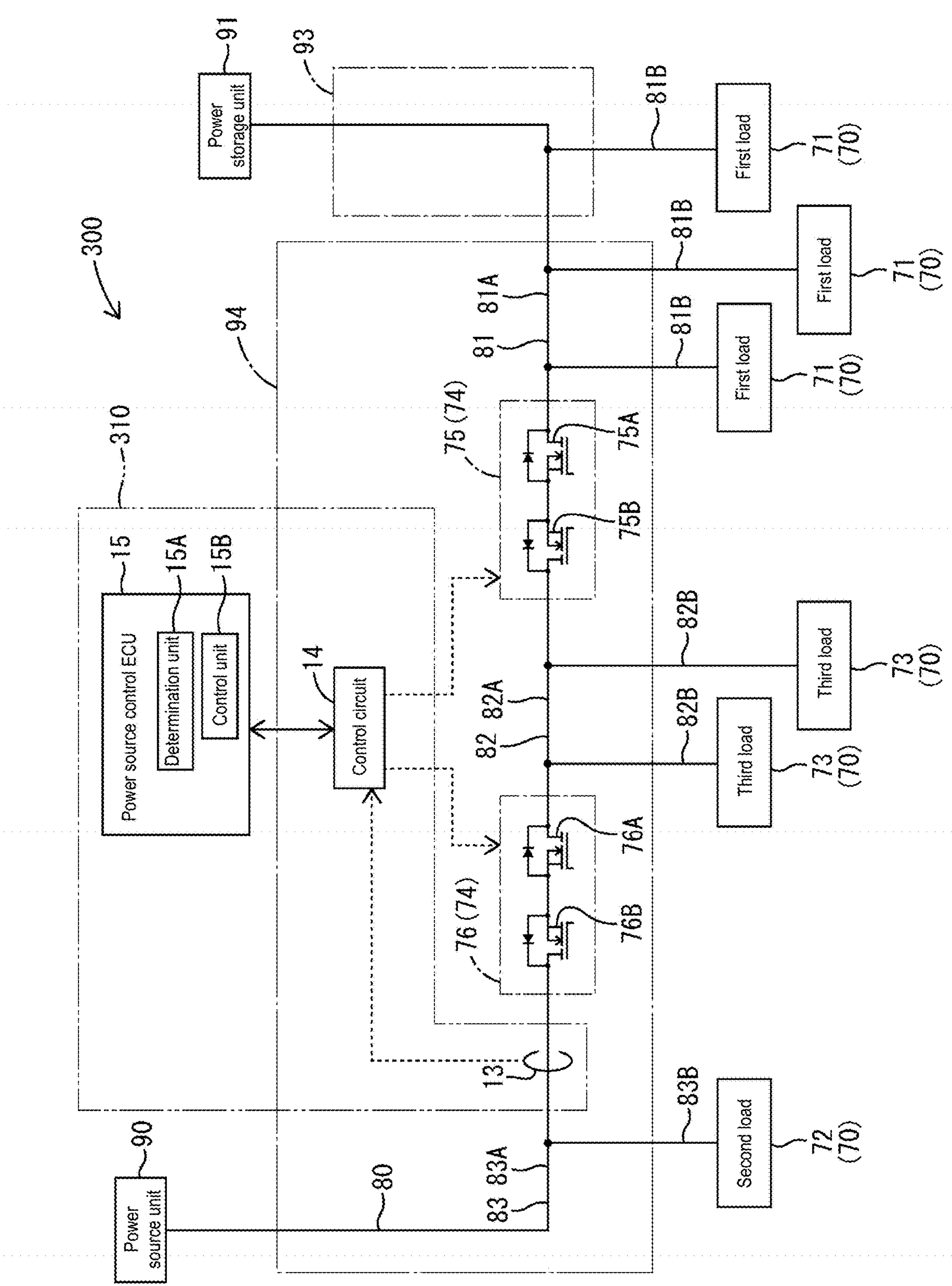
FIG. 7 is a circuit diagram schematically showing a configuration of an on-board system according to a third embodiment.

An on-board system 300 according to a third embodiment shown in FIG. 7 and the on-board system 100 according to the first embodiment are different in the determination method that is performed by the determination unit, and are the same with respect to the other configurations. In the following description, the same configurations as the on-board system 100 according to the first embodiment are given the same reference numerals, and a detailed description is omitted.

The current detection unit 13 can detect a current flowing through the third conductive path 83. More specifically, the current detection unit 13 can detect a current flowing through a path between the second disconnection unit 76 and the branch point at which the third branch path 83B branches from the third main path 83A. The current detection unit 13 is configured as a known current detection circuit that uses a current transformer or a shunt resistor, for example. The current detection unit 13 outputs a signal that enables the detected current to be specified.

The control circuit 14 includes an MCU, an AD converter, a drive circuit, a communication unit, and the like. A signal output from the current detection unit 13 is input to the control circuit 14. The control circuit 14 can specify the value of a current flowing through the third conductive path 83 based on the input signal. The control circuit 14 can detect a ground fault on the second conductive path 82 and the third conductive path 83. In a state where power is being supplied from at least one of the power source unit 90 and the power storage unit 91 to the loads 70, the control circuit 14 determines whether or not the value of a current flowing through the third conductive path 83 has exceeded a predetermined threshold current. The control circuit 14 determines that neither the second conductive path 82 nor the third conductive path 83 has a ground fault, if it is determined that the value of a current flowing through the third conductive path 83 is lower than or equal to the threshold current, and determines that at least one of the second conductive path 82 and the third conductive path 83 has a ground fault, if it is determined that the value of a current flowing through the third conductive path 83 has exceeded the threshold current.

The power source control ECU 15 can obtain, from the control circuit 14, the value of a current flowing through the second conductive path 82 and the third conductive path 83. In addition, the power source control ECU 15 can grasp that a ground fault on at least one of the second conductive path 82 and the third conductive path 83 has been detected, based on a signal input from the control circuit 14.

When a ground fault on at least one of the second conductive path 82 and the third conductive path 83 is detected by the control circuit 14, the determination unit 15A determines whether the ground fault site is on the second conductive path 82 side or the third conductive path 83 side. The determination unit 15A determines whether the ground fault site is on the second conductive path 82 side or the third conductive path 83 side, based on the direction of a current flowing through the third conductive path 83. If the ground fault site is on the second conductive path 82 side, the direction of the current is the direction from the third conductive path 83 side to the second conductive path 82 side, and, if the ground fault site is on the third conductive path 83 side, the direction of the current is the direction from the second conductive path 82 side to the third conductive path 83 side. Thus, the determination unit 15A can specify the direction of a current based on the value of a current flowing through the third conductive path 83, and can determine whether the ground fault site is on the second conductive path 82 side or the third conductive path 83 side, based on the direction of the current.

The control unit 15B can control the first disconnection unit 75 and the second disconnection unit 76 through the control circuit 14. If it is determined that the ground fault site is on the third conductive path 83 side, the control unit 15B switches the second disconnection unit 76 to the second disconnected state while maintaining the first disconnection unit 75 in the first allowed state. Accordingly, similarly to the example shown in FIG. 2, a ground fault detection apparatus 310 can supply power from the power storage unit 91 to the first loads 71 and the third loads 73. If it is determined that the ground fault site is on the second conductive path 82 side, the control unit 15B switches the first disconnection unit 75 to the first disconnected state, and switches the second disconnection unit 76 to the second disconnected state. Accordingly, similarly to the example shown in FIG. 3, the ground fault detection apparatus 310 can supply power from the power storage unit 91 to the first loads 71, and supply power from the power source unit 90 to the second load 72.

As described above, with the ground fault detection apparatus 310 according to the third embodiment, it is possible to determine whether the ground fault site is on the second conductive path 82 side or the third conductive path 83 side without detecting the voltages of the second conductive path 82 and the voltage of the third conductive path 83.

Furthermore, if it is determined that the ground fault site is on the third conductive path 83 side, the ground fault detection apparatus 310 switches the second disconnection unit 76 to the second disconnected state while maintaining the first disconnection unit 75 in the first allowed state. In addition, if it is determined that the ground fault site is on the second conductive path 82 side, the ground fault detection apparatus 310 switches the first disconnection unit 75 to the first disconnected state, and switches the second disconnection unit 76 to the second disconnected state. Accordingly, the ground fault detection apparatus 310 can keep power supply to the first loads 71 from stopping irrespective of whether the ground fault site is on the second conductive path 82 side or the third conductive path 83 side, and if the ground fault site is on the second conductive path 82 side, can keep power supply to the second load 72 from stopping.

Other Embodiment

The present disclosure is not limited to the embodiments described above with reference to the drawings. Any combination of characteristics in the embodiments described above and below can be made as long as no contradictions arise. In addition, any characteristics in the embodiment described above and below can be omitted unless explicitly stated as essentials. Furthermore, the above embodiments may be changed as follows.

In the above embodiments, a configuration is adopted in which the importance of a load is defined based on function safety levels stipulated by ISO26262, but another configuration may be adopted. A configuration may also be adopted in which the importance of a load is defined based on another stipulation, for example. In addition, in the above embodiments, loads to which ASIL-A to D are allocated are provided as essential loads, but another configuration may be adopted. Loads to which ASIL-B to D are allocated or loads to which ASIL-C to D are allocated may be provided as essential loads, or only a load to which ASIL-D is allocated may be provided as an essential load, for example.

In the above embodiments, a configuration is adopted in which first loads includes only essential loads, but a configuration may also be adopted in which first loads include a load other than an essential load. In the above embodiments, a configuration is adopted in which a second load includes only a power steering apparatus, but a configuration may also be adopted in which second loads include a load other than the power steering apparatus.

In the above first and second embodiments, a configuration is adopted in which, when a current flowing through the third conductive path has exceeded a threshold current, the control circuit determines that a ground fault has occurred on at least one of the second conductive path and the third conductive path, but another configuration may be adopted. A configuration may also be adopted in which, for example, when a current flowing through the second conductive path has exceeded a threshold current, the control circuit determines that a ground fault has occurred on at least one of the second conductive path and the third conductive path. Alternatively, a configuration may be adopted in which, when the voltage of the second conductive path decreases to a threshold voltage or lower, the control circuit determines that a ground fault has occurred on at least one of the second conductive path and the third conductive path, or when the voltage of the third conductive path decreases to a threshold voltage or lower, the control circuit determines that a ground fault has occurred on at least one of the second conductive path and the third conductive path.

In the above first and second embodiments, a configuration is adopted in which, if it is determined that the voltage of the second conductive path is lower than or equal to a threshold voltage, it is determined that the ground fault site is on the second conductive path, and if it is determined that the voltage of the third conductive path is lower than or equal to the threshold voltage, it is determined that the ground fault site is on the third conductive path. However, a configuration may also be adopted in which, if it is determined that the voltage of the second conductive path is lower than or equal to the threshold voltage, it is determined that the ground fault site is on the second conductive path, and, if it is determined that the voltage of the second conductive path is not lower than or equal to the threshold voltage, it is determined that the ground fault site is on the third conductive path. Alternatively, a configuration may also be adopted in which, if it is determined that the voltage of the third conductive path is lower than or equal to a threshold voltage, it is determined that the ground fault site is on the third conductive path, and, if it is determined that the voltage of the third conductive path is not lower than or equal to the threshold voltage, it is determined that the ground fault site is on the second conductive path.

In the above second embodiment, determination as to whether a ground fault site is on the second conductive path or the third conductive path may be performed by a determination method similar to that in the third embodiment.

In the above third embodiment, a configuration is adopted in which the current detection unit detects a current of the third conductive path, but a configuration may also be adopted in which a current of the second conductive path is detected. In this case, the current detection unit preferably detects a current flowing through a path between the second disconnection unit and a branch point that is closest to the second disconnection unit from among the branch points at which the second branch paths branch from the second main path.

Note that the embodiments disclosed herein are to be considered as illustrative and non-limiting in all aspects. The scope of the present disclosure is not limited by the embodiments disclosed herein, and all changes that come within the range indicated by the claims or the range of equivalency of the claims are intended to be embraced therein.

The invention claimed is:

1. A ground fault detection apparatus that is used for an on-board system that includes:

a power source unit, a power storage unit that is different from the power source unit, a conductive path provided between the power source unit and the power storage unit, and loads connected to the conductive path, a disconnection unit provided on the conductive path, and a determination unit, wherein the disconnection unit includes a first disconnection unit provided between the power source unit and the power storage unit, and a second disconnection unit provided on the power source unit side relative to the first disconnection unit, the conductive path includes a first conductive path provided between the power storage unit and the first disconnection unit, a second conductive path provided between the first disconnection unit and the second disconnection unit, and a third conductive path provided between the second disconnection unit and the power source unit, the loads include a first load that includes an essential load, a second load that includes a power steering apparatus, and a third load that is less important than the essential load, the first load is connected to the first conductive path, the second load is connected to one path out of the second conductive path and the third conductive path, the third load is connected to the other path out of the second conductive path and the third conductive path, the first disconnection unit is switched between a first allowed state in which a current is allowed to flow from the first conductive path side to the second conductive path side and a first disconnected state where the current is stopped, the second disconnection unit is switched between a second allowed state where a current is allowed to flow from the second conductive path side to the third conductive path side and from the third conductive path side to the second conductive path side and a second disconnected state where the current is stopped, the ground fault detection apparatus includes a detection unit configured to detect a ground fault on at least one of the second conductive path and the third conductive path, and wherein the determination unit is configured to determine, when a ground fault is detected on at least one of the second conductive path and the third conductive path by the detection unit, whether the ground fault site is on the second conductive path side or the third conductive path side, and wherein the determination unit determines whether a ground fault site is on the second conductive path side or the third conductive path side, based on a voltage of at least one of the second conductive path and the third conductive path when the first disconnection unit is in the first disconnected state and the second disconnection unit is in the second disconnected state.

2. The ground fault detection apparatus according to claim 1, further comprising a control unit configured to perform control so as to switch the first disconnection unit to the first disconnected state and perform control so as to switch the second disconnection unit to the second disconnected state when a ground fault is detected on at least one of the second conductive path and the third conductive path by the detection unit, the determination unit determines whether a ground fault site is on the second conductive path side or the third conductive path side, based on a voltage of at least one of the second conductive path and the third conductive path, in a state where the control unit performs control so as to switch the first disconnection unit to the first disconnected state and performs control so as to switch the second disconnection unit to the second disconnected state.

3. The ground fault detection apparatus according to claim 2, wherein the second load is connected to the third conductive path.

4. The ground fault detection apparatus according to claim 2, wherein the second load is connected to the second conductive path.

5. The ground fault detection apparatus according to claim 1, wherein the determination unit includes a current detection unit configured to detect a current flowing through at least one of the second conductive path and the third conductive path, and determines whether the ground fault site is on the second conductive path side or the third conductive path side, based on a direction of a current flowing through at least one of the second conductive path and the third conductive path.

6. The ground fault detection apparatus according to claim 5, wherein the second load is connected to the second conductive path.

7. The ground fault detection apparatus according to claim 1, wherein the second load is connected to the third conductive path, and the ground fault detection apparatus includes a control unit configured to perform at least one of an operation of performing control so as to switch the first disconnection unit to the first disconnected state and an operation of performing control so as to switch the second disconnection unit to the second disconnected state if it is determined by the determination unit that a ground fault site is on the third conductive path side, and perform control so as to switch the first disconnection unit to the first disconnected state and perform control so as to switch the second disconnection unit to the second disconnected state if it is determined by the determination unit that a ground fault site is on the second conductive path side.

8. The ground fault detection apparatus according to claim 1, wherein the second load is connected to the second conductive path, and the ground fault detection apparatus includes a control unit configured to perform control so as to switch the first disconnection unit to the first allowed state and perform control so as to switch the second disconnection unit to the second disconnected state if it is determined by the determination unit that a ground fault site is on the third conductive path side, and perform control so as to switch the first disconnection unit to the first disconnected state if it is determined that a ground fault site is on the second conductive path side.

9. The ground fault detection apparatus according to claim 1, wherein the second load is connected to the second conductive path.

* * * * *